United States Patent
Toh et al.

(10) Patent No.: US 8,102,652 B2
(45) Date of Patent: Jan. 24, 2012

(54) BASE FOR POWER MODULE

(75) Inventors: Keiji Toh, Kariya (JP); Shogo Mori, Kariya (JP); Hideyasu Obara, Kariya (JP); Nobuhiro Wakabayashi, Oyama (JP); Shintaro Nakagawa, Oyama (JP); Shinobu Yamauchi, Oyama (JP)

(73) Assignees: Kabushiki Kaisha Toyota Jidoshokki, Kariya-shi (JP); Showa Denko K.K., Tokyo (JP)

( * ) Notice: Subject to any disclaimer, the term of this patent is extended or adjusted under 35 U.S.C. 154(b) by 161 days.

(21) Appl. No.: 12/282,729

(22) PCT Filed: Mar. 8, 2007

(86) PCT No.: PCT/JP2007/054503
§ 371 (c)(1),
(2), (4) Date: Nov. 28, 2008

(87) PCT Pub. No.: WO2007/105580
PCT Pub. Date: Sep. 20, 2007

(65) Prior Publication Data
US 2010/0002397 A1 Jan. 7, 2010

(30) Foreign Application Priority Data
Mar. 13, 2006 (JP) .................................. 2006-67223

(51) Int. Cl.
*H05K 7/20* (2006.01)
*H01L 23/34* (2006.01)
*F28F 7/00* (2006.01)

(52) U.S. Cl. ....... 361/699; 257/714; 174/15.1; 174/252; 165/80.4; 165/104.33; 361/715

(58) Field of Classification Search .................. 361/699; 257/714, 716, 717, 706, E23.098; 174/15.1, 174/252; 165/80.4–80.5, 104.33
See application file for complete search history.

(56) References Cited

U.S. PATENT DOCUMENTS

| 5,134,463 | A | * | 7/1992 | Yamaguchi | 257/712 |
| 5,358,795 | A | | 10/1994 | Nakamura et al. | |
| 5,504,378 | A | * | 4/1996 | Lindberg et al. | 307/10.1 |
| 6,154,369 | A | | 11/2000 | Martinez, Jr. et al. | |
| 6,931,131 | B1 | * | 8/2005 | Becker et al. | 380/258 |
| 2004/0145048 | A1 | * | 7/2004 | Frisch et al. | 257/712 |
| 2007/0230133 | A1 | * | 10/2007 | Michel et al. | 361/708 |
| 2009/0219694 | A1 | * | 9/2009 | Marz et al. | 361/699 |

FOREIGN PATENT DOCUMENTS
JP  5 109947   4/1993
(Continued)

*Primary Examiner* — Zachary M Pape
(74) *Attorney, Agent, or Firm* — Oblon, Spivak, McClelland, Maier & Neustadt, L.L.P.

(57) ABSTRACT

A power module base includes a heat radiation substrate formed of a high-thermal-conduction material, an insulating substrate joined to an upper surface of the heat radiation substrate, a wiring layer provided on an upper surface of the insulating substrate, and a heat radiation fin joined to a lower surface of the heat radiation substrate. A component attachment plate thicker than the heat radiation substrate and including a through hole for accommodating the insulating substrate is joined to the upper surface of the heat radiation substrate such that the insulating substrate is located within the through hole. This power module base can maintain the upper surface of the component attachment plate flat, and various components required for a power module, such as a casing, can be attached onto the component attachment plate.

11 Claims, 5 Drawing Sheets

FOREIGN PATENT DOCUMENTS

| | | |
|---|---|---|
| JP | 11 297906 | 10/1999 |
| JP | 2001 168256 | 6/2001 |
| JP | 2003-86744 | 3/2003 |
| JP | 2004 103936 | 4/2004 |
| JP | 2004 134542 | 4/2004 |
| JP | 2004 153075 | 5/2004 |
| WO | WO 2006109660 A1 * | 10/2006 |

* cited by examiner

BASE FOR POWER MODULE

TECHNICAL FIELD

The present invention relates to a base for a power module which partially constitutes a power module.

The term "aluminum" as used herein and in the appended claims encompasses aluminum alloys in addition to pure aluminum, except for the case where "aluminum nitride," "aluminum oxide," or "pure aluminum" is specified. Further, the term "copper" as used herein and in the appended claims encompasses copper alloys in addition to pure copper.

BACKGROUND ART

In a power module which includes a power device formed of a semiconductor device, such as an IGBT (Insulated Gate Bipolar Transistor), the semiconductor device must be held at a predetermined temperature or lower by means of efficiently radiating heat generated therefrom. A base for a power module (hereinafter referred to as a "power module base") which meets the requirement has conventionally been proposed (see Patent Document 1). The power module base includes a ceramic insulating substrate having an aluminum wiring layer formed on one face thereof and an aluminum heat transfer layer formed on the other face thereof; an aluminum heat radiation substrate brazed to the heat transfer layer of the insulating substrate; and an aluminum heat sink brazed to a side of the heat radiation substrate opposite the side brazed to the insulating substrate. A cooling liquid flow path is formed within the heat sink.

In the case of the power module base described in Patent Document 1, a power device is mounted on the wiring layer of the insulating substrate, and various components necessary for the power device, such as a resin casing for covering the insulating substrate and the power device, are attached onto the heat radiation substrate. Alternatively, an electrical wiring frame, electronic components, etc. are attached onto the heat radiation substrate. Thus, a power module is completed. Such a power module is applied to an inverter circuit of a movable body such as a hybrid car in which an electric motor is used as a portion of a drive source, and the power module controls electric power supplied to the motor in accordance with the operating state of the movable body.

Heat generated from the power device is transferred to the heat sink via the wiring layer, the insulating substrate, the heat transfer layer, and the heat radiation substrate, and is radiated into a cooling liquid flowing through the cooling liquid flow path.

Incidentally, in the case of the power module base described in Patent Document 1, when the insulating substrate, the heat radiation substrate, and the heat sink are heated at the time of heating for brazing, the insulating substrate, the heat radiation substrate, and the heat sink thermally expand. The insulating substrate, the heat radiation substrate, and the heat sink are brazed in a thermally expanded state, and thermally contract after completion of the heating. The heat radiation substrate and the heat sink, which are formed of aluminum whose linear expansion coefficient is relative high, tend to thermally expand by a relatively large amount upon heating at the time of brazing. Meanwhile, the linear expansion coefficient of the ceramic which constitutes the insulating substrate is lower than that of aluminum. Therefore, even when the insulating substrate is heated at the time of brazing, the insulating substrate does not thermally expand greatly, as compared with the heat radiation substrate and the heat sink. As a result, the degrees of thermal contraction of the heat radiation substrate and the heat sink become greater than that of the insulating substrate. Therefore, if no measure is taken, when the insulating substrate, the heat radiation substrate, and the heat sink thermally contract as a result of being cooled to room temperature after completion of brazing, the degrees of contraction of the heat radiation substrate and the heat sink become greater than that of the insulating substrate, and the heat radiation substrate and the heat sink are pulled by the insulating substrate, so that deformation such as warpage arises in the heat radiation substrate. As a result, it becomes impossible to accurately attach various components onto the heat radiation substrate. For example, in the case of a resin casing for covering the insulating substrate and the power device, there is a possibility that the resin casing cannot be attached in a sealed condition without forming a clearance. Further, there is a possibility that an electrical wiring frame and components necessary for the power module, such as electronic components, cannot be accurately attached.

In the case of the power module base described in Patent Document 1, the above-described warpage of the heat radiation substrate and the heat sink is suppressed by increasing the thickness of the heat radiation substrate. However, if the thickness of the heat radiation substrate is increased, the heat conduction path from the power device to the heat sink increases in length, and heat radiation performance may drop.

Patent Document 1: Japanese Patent Application Laid-Open (kokai) No. 2003-86744

DISCLOSURE OF THE INVENTION

Problems to be Solved by the Invention

An object of the present invention is to solve the above problem and to provide a power module base which allows accurate attachment of components necessary for a power module, such as a casing for covering an insulating substrate and a power device, and can prevent a drop in heat radiation performance.

Means for Solving the Problems

To achieve the above object, the present invention comprises the following modes.

1) A power module base comprising a heat radiation substrate formed of a high-thermal-conduction material; an insulating substrate joined to one surface of the heat radiation substrate; a wiring layer provided on a surface of the insulating substrate opposite the side where the insulating substrate is joined to the heat radiation substrate; and a heat radiation fin joined to the other surface of the heat radiation substrate, wherein a component attachment plate which is thicker than the heat radiation substrate and has a through hole for accommodating the insulating substrate is joined to the surface of the heat radiation substrate, to which surface the insulating substrate is joined, such that the insulating substrate is located within the through hole.

2) A power module base according to par. 1), wherein a cooling jacket is fixed to the surface of the heat radiation substrate, to which surface the heat radiation fin is joined, such that the cooling jacket covers the heat radiation fin; and a cooling liquid flows within the cooling jacket.

3) A power module base according to par. 1) or 2), wherein the insulating substrate and the heat radiation substrate are brazed together, the heat radiation substrate and the heat radiation fin are brazed together, and the heat radiation substrate and the component attachment plate are brazed together.

4) A power module base according to any of pars. 1) to 3), wherein a second component attachment plate is joined to an outer surface of a wall portion of the cooling jacket facing the heat radiation substrate.

5) A power module base according to par. 4), wherein the two component attachment plates are connected together.

6) A power module base according to any of pars. 1) to 5), wherein a heat transfer layer formed of a high-thermal-conduction material is provided on the surface of the insulating substrate opposite the side where the wiring layer is provided; and the heat transfer layer and the heat radiation substrate are joined together.

7) A power module base according to any of pars. 1) to 5), wherein the surface of the insulating substrate opposite the side where the wiring layer is provided is joined directly to the heat radiation substrate.

8) A power module base according to any of pars. 1) to 7), wherein the insulating substrate is formed of a ceramic, and the ceramic is formed of aluminum nitride, aluminum oxide, or silicon nitride.

9) A power module base according to any of pars. 1) to 8), wherein the wiring layer is formed of aluminum or copper.

10) A power module base according to any of pars. 1) to 9), wherein a stress relaxation member formed of a high-thermal-conduction material is interposed between the insulating substrate and the heat radiation substrate, and the stress relaxation member is joined to the insulating substrate and to the heat radiation substrate.

11) A power module base according to par. 10), wherein the stress relaxation member comprises a plate-like body having a plurality of through holes formed therein.

12) A power module base according to par. 10), wherein the stress relaxation member comprises a plate-like main body and a plurality of protrusions integrally formed on at least one surface of the plate-like main body such that the protrusions are separated from one another.

13) A power module base according to par. 10), wherein the stress relaxation member is formed of a material having a linear expansion coefficient between that of the insulating substrate and that of the heat radiation substrate.

14) A power module base according to par. 10), wherein the stress relaxation member is formed of a porous material.

15) A power module comprising a power module base according to any of pars. 1) to 14) and a power device mounted on the wiring layer of the insulating substrate of the power module base.

16) A power module according to par. 15), further comprising a casing attached to the component attachment plate and covering the power device and the insulating substrate of the power module base.

Effects of the Invention

According to the power module base of par. 1), the following advantageous effects are attained. In the case where the joining of the insulating substrate, the heat radiation substrate, the heat radiation fin, and the component attachment plate is performed by, for example, brazing, the insulating substrate, the heat radiation substrate, and the component attachment plate thermally expand at the time of heating for brazing, and are brazed together in a thermally expanded state. Subsequently, the insulating substrate, the heat radiation substrate, and the component attachment plate thermally contract after completion of the heating. Since the heat radiation substrate is formed of a high-thermal-conduction material such as aluminum and its linear expansion coefficient is larger than that of the insulating substrate, the degree of thermal expansion of the heat radiation substrate is greater than that of the insulating substrate, and, as a result, the degree of thermal contraction of the heat radiation substrate is greater than that of the insulating substrate. Therefore, when the insulating substrate and the heat radiation substrate thermally contract as a result of being cooled to room temperature after completion of brazing, the degree of contraction of the heat radiation substrate becomes larger than that of the insulating substrate, and the heat radiation substrate is pulled by the insulating substrate, so that deformation such as warpage arises in the heat radiation substrate. However, since the component attachment plate is thicker than the heat radiation substrate and is high in rigidity, the component attachment plate is not affected by the deformation of the heat radiation substrate, and the surface of the component attachment plate opposite the surface joined to the heat radiation substrate is maintained flat. Accordingly, various components can be accurately attached. For example, when a casing for covering a power device and the insulating substrate of the power module base is attached to the component attachment plate, no clearance is formed between the casing and the component attachment plate, and the interior of the casing can be maintained in a sealed condition. Further, an electrical wiring frame and components necessary for the power module, such as electronic components, can be accurately attached.

In addition, unlike the power module base disclosed in Patent Document 1, the thickness of the heat radiation substrate is not required to increase. Therefore, a heat conduction path from the power device to the heat radiation fin becomes relatively short, whereby a drop in heat radiation performance is suppressed.

According to the power module base of par. 2), heat generated from the power device mounted on the insulating substrate is conducted to the heat radiation fin via the insulating substrate and the heat radiation substrate, and is radiated from the heat radiation fin to a cooling liquid flowing within the cooling jacket. Accordingly, a relatively excellent heat radiation performance is attained.

In the case where the insulating substrate and the heat radiation substrate are brazed together, the heat radiation substrate and the heat radiation fin are brazed together, and the heat radiation substrate and the component attachment plate are brazed together as in the power module base of par. 3), the insulating substrate, the heat radiation substrate, and the component attachment plate thermally expand at the time of heating for brazing, and are brazed together in a thermally expanded state. Subsequently, the insulating substrate, the heat radiation substrate, and the component attachment plate thermally contract after completion of the heating. Since the heat radiation substrate is formed of a high-thermal-conduction material such as aluminum and its linear expansion coefficient is larger than that of the insulating substrate, the degree of thermal expansion of the heat radiation substrate is greater than that of the insulating substrate, and, as a result, the degree of thermal contraction of the heat radiation substrate is greater than that of the insulating substrate. Therefore, when the insulating substrate and the heat radiation substrate thermally contract as a result of being cooled to room temperature after completion of brazing, the degree of contraction of the heat radiation substrate becomes larger than that of the insulating substrate, and the heat radiation substrate is pulled by the insulating substrate, so that deformation such as warpage arises in the heat radiation substrate. However, since the component attachment plate is thicker than the heat radiation substrate and is high in rigidity, the component attachment plate is not affected by the deformation of the heat radiation substrate, and the surface of the component attachment plate opposite the surface joined to the heat radiation substrate is maintained flat. Accordingly, various components can be accurately attached. For example, when a casing for covering the power device and the insulating substrate of the power module base is attached to the component attachment plate, no clearance is formed between the casing and the component attachment plate, and the interior of the casing can be maintained in a sealed condition. Further, an electrical wiring frame and components necessary for the power module, such as electronic components, can be accurately attached.

According to the power module base of par. 4), a housing for accommodating the entire power module, an electrical wiring frame, and various components necessary for the power module can be attached by making use of the second component attachment plate. In addition, in the case where these components generate heat, these heat generating components can be cooled by a cooling liquid flowing through the cooling jacket.

According to the power module base of par. 6), heat conducting from the power device mounted on the insulating substrate is conducted to the heat radiation substrate while being dispersed in the direction of the plane of the heat transfer layer. Therefore, the heat conduction to the heat radiation substrate and thus to the heat radiation fin is improved.

A power device is mounted onto the wiring layer of the insulating substrate, whereby a power module is completed. Such a power module is applied to an inverter circuit of a hybrid car in which an electric motor is used as a portion of a drive source, and the power module controls electric power supplied to the motor in accordance with the operating state. Heat generated from the power device is transferred to the heat radiation fin via the wiring layer, the insulating substrate, and the heat radiation substrate, and is radiated from the heat radiation fin. According to the power module base of any of pars. 10) to 14), a stress relaxation member formed of a high-thermal-conduction material is interposed between the insulating substrate and the heat radiation substrate, and is joined to the insulating substrate and the heat radiation substrate. Therefore, the following advantageous effects are attained. That is, since the power module base is heated to a high temperature (e.g., about 150° C.) by heat generated from the power device, the insulating substrate and the heat radiation substrate thermally expand. In particular, in the case where the heat radiation substrate is formed of aluminum that is relatively excellent in thermal conductivity, since the linear expansion coefficient of aluminum is greater than that of the insulating substrate, the heat radiation substrate is pulled by the insulating substrate and is apt to warp due to a difference in thermal expansion between the heat radiation substrate and the insulating substrate, whereby a thermal stress is generated. However, by virtue of the action of the stress relaxation member, the thermal stress is relaxed, whereby generation of a crack in the insulating substrate, generation of a crack in a joint portion between the insulating substrate and the stress relaxation member, and generation of a warpage in the heat radiation substrate are prevented. Accordingly, a satisfactory heat radiation performance is maintained for a long period of time.

BEST MODE FOR CARRYING OUT THE INVENTION

Embodiments of the present invention will next be described with reference to the drawings. In the following description, the upper, lower, left-hand, and right-hand sides of FIG. 1 will be referred to as "upper," "lower," "left," and "right," respectively.

FIG. 1 shows the overall structure of a power module which uses a power module base according to the present invention.

In FIG. 1, the power module base (1) includes a heat radiation substrate (2); an insulating substrate (3) brazed to an upper surface of the heat radiation substrate (2); a heat radiation fin (4) brazed to a lower surface of the heat radiation substrate (2); an upper component attachment plate (5) brazed to a portion of the upper surface of the heat radiation substrate (2), the portion surrounding the insulating substrate (3); a cooling jacket (6) fixed to the lower surface of the heat radiation substrate (2) and covering the heat radiation fin (4); and a lower component attachment plate (7) (a second component attachment plate) brazed to a lower surface of the cooling jacket (6).

The heat radiation substrate (2) is formed of a high-thermal-conduction material, such as aluminum or copper (in the present embodiment, formed of aluminum). The thickness of the heat radiation substrate (2) is preferably 0.1 to 1.0 mm, desirably about 0.4 mm.

The insulating substrate (3) may be formed of any insulating material, so long as it satisfies requirements for insulating characteristics, thermal conductivity, and mechanical strength. For example, when a ceramic is used to form the insulating substrate (3), aluminum oxide, aluminum nitride, or silicon nitride is used. The thickness of the insulating substrate (3) is preferably 0.1 to 1 mm. A wiring layer (8) is provided on an upper surface of the insulating substrate (3), and a heat transfer layer (9) is provided on a lower surface of the insulating substrate (3). The wiring layer (8) is formed of a metal having excellent electrical conductivity, such as aluminum or copper. Preferably, the wiring layer (8) is formed of a pure aluminum having high purity, which exhibits high electrical conductivity, high deformability, and excellent solderability in relation to a semiconductor device. The heat transfer layer (9) is formed of a metal having excellent thermal conductivity, such as aluminum or copper. Preferably, the heat transfer layer (9) is formed of a pure aluminum having high purity, which exhibits high thermal conductivity, high deformability, and excellent wettability in relation to a molten brazing material. Preferably, the wiring layer (8) and the heat transfer layer (9) are formed of the same material. Further, the thickness of each of the wiring layer (8) and the heat transfer layer (9) is preferably 0.1 to 1.0 mm, desirably about 0.6 mm. The heat transfer layer (9) is brazed to the heat radiation substrate (2). Notably, a DBA (Direct Brazed Aluminum (registered trademark)) substrate, a DBC (Direct Bonded Copper (registered trademark)) substrate, or a like substrate may be used as the insulating substrate (3) having the wiring layer (8) and the heat transfer layer (9) previously provided thereon.

The heat radiation fin (4) is formed of a high-thermal-conduction material, such as aluminum or copper (in the present embodiment, formed of aluminum). The heat radiation fin (4), which assumes a corrugate shape, includes wave crest portions, wave trough portions, and connection portions connecting the wave crest portions and the wave trough portions. The heat radiation fin (4) is brazed to the heat radiation substrate (2) such that the longitudinal direction of each of the wave crest portions and the wave trough portions becomes parallel to a direction perpendicular to the sheet of FIG. 1. Approximately, the heat radiation fin (4) has a thickness of 0.5 mm, a fin height of 10 mm, and a fin pitch of 1.3 mm.

The upper component attachment plate (5) is formed of the same material as the heat radiation substrate (2) (in the present embodiment, aluminum), and has a flat upper surface.

A through hole (11) for accommodating the insulating substrate (3) is formed in the upper component attachment plate (5). The upper component attachment plate (5) is thicker than the heat radiation substrate (2) and preferably has a thickness of 1.0 to 3 mm, desirably about 2 mm. In this case, the rigidity of the upper component attachment plate (5) can be made sufficiently larger than that of the heat radiation substrate (2), and deformation of the upper component attachment plate (5) in the course of manufacture of the power module base (1) to be described later can be prevented. The upper component attachment plate (5) is brazed to the upper surface of the heat radiation substrate (2) such that the insulating substrate (3) is located within the through hole (11).

Notably, in the case where a plurality of insulating substrates (3) are brazed to the upper surface of the heat radiation substrate (2), through holes each accommodating one insulating substrate (3) may be formed in the upper component attachment plate (5) such that the number of the through holes becomes equal to the number of the insulating substrates (3). Alternatively, a single through hole for accommodating all the insulating substrates (3) may be formed in the upper component attachment plate (5), or through holes each accommodating one or more insulating substrates (3) may be formed in the upper component attachment plate (5) such that the number of the through holes becomes less than the number of the insulating substrates (3).

The cooling jacket (6) is formed of the same material as the heat radiation substrate (2) (in the present embodiment, aluminum). The cooling jacket (6) includes a circumferential wall (6a) which is brazed to the lower surface of the heat radiation substrate (2) and is formed of a metal (in the present embodiment, aluminum), and a bottom wall (6b) which is brazed to the circumferential wall (6a) and closes the lower end opening of the circumferential wall. The circumferential wall (6a) and the bottom wall (6b) form a generally box-like shape. Although not illustrated, a cooling liquid inlet pipe and a cooling liquid outlet pipe are connected to the circumferential wall (6a) of the cooling jacket (6). A cooling liquid fed into the cooling liquid inlet pipe flows within the cooling jacket (6), and is discharged from the cooling liquid outlet pipe.

The lower component attachment plate (7) is formed of the same material as the upper component attachment plate (5) (in the present embodiment, aluminum), and is brazed to a lower surface of the bottom wall (6b) of the cooling jacket (6). A plurality of internal thread members (12) each having a threaded through hole (12a) are disposed between a circumferential edge portion of the upper component attachment plate (5) and a circumferential edge portion of the lower component attachment plate (7) at proper intervals in the circumferential direction. The internal thread members (12) are brazed to the upper component attachment plate (5) and the lower component attachment plate (7), whereby the upper and lower component attachment plates (5) and (7) are connected together. Further, through holes (5a) and (7b) are formed in the upper component attachment plate (5) and the lower component attachment plate (7), respectively, at positions corresponding to the threaded holes (12a) of the internal thread members (12). Although not illustrated in the drawings, at positions where the internal thread members (12) are not disposed, predetermined portions of the circumferential edge portion of the upper component attachment plate (5) are bent toward the lower component attachment plate (7), predetermined portions of the circumferential edge portion of the lower component attachment plate (7) are bent toward the upper component attachment plate (5), and bent portions of the plates (5) and (7) are brazed together.

Notably, the power module base (1) may be configured such that the heat transfer layer (9) is not formed on the lower surface of the insulating substrate (3), and the insulating substrate (3) is brazed directly to the heat radiation substrate (2).

The power module base (1) is manufactured as follows.

That is, the heat radiation substrate (2) is placed on the lower surface of the insulating substrate (3), and the upper component attachment plate (5) is placed on the upper surface of the heat radiation substrate (2) such that the insulating substrate (3) is located within the through hole (11). Further, the heat radiation fin (4), the circumferential wall (6a) and the bottom wall (6b) of the cooling jacket (6) are disposed on the lower surface of the heat radiation substrate (2). Moreover, the lower component attachment plate (7) is placed on the lower surface of the bottom wall (6b) of the cooling jacket (6), and the internal thread members (12) are disposed between the upper component attachment plate (5) and the lower component attachment plate (7). A sheet-shaped aluminum brazing material formed of an Al—Si based alloy, an Al—Si—Mg based alloy, or the like is interposed between the heat radiation substrate (2) and the heat transfer layer (9) of the insulating substrate (3), between the heat radiation substrate (2) and the heat radiation fin (4) and the circumferential wall (6a), between the heat radiation substrate (2) and the upper component attachment plate (5), between the bottom wall (6b) and the heat radiation fin (4) and the circumferential wall (6a), and between the bottom wall (6b) and the lower component attachment plate (7), and between the internal thread members (12) and the upper component attachment plate (5) and the lower component attachment plate (7). Notably, the aluminum brazing material formed of an Al—Si based alloy, an Al—Si—Mg based alloy, or the like is interposed between the bent portions of the two plates (5) and (7).

Next, the heat radiation substrate (2), the insulating substrate (3), the heat radiation fin (4), the upper component attachment plate (5), the circumferential wall (6a) and the bottom wall (6b) of the cooling jacket (6), the lower component attachment plate (7), and the internal thread members (12) are provisionally fixed by proper means such that a proper load is imposed on each joint surface. In this state, the above-described members are heated to a 570 to 600° C. in a vacuum atmosphere or in an inert gas atmosphere, whereby brazing is effected simultaneously between the heat radiation substrate (2) and the heat transfer layer (9) of the insulating substrate (3), between the heat radiation substrate (2) and the heat radiation fin (4), between the heat radiation substrate (2) and the upper component attachment plate (5), between the heat radiation substrate (2) and the circumferential wall (6a), between the heat radiation fin (4) and the circumferential wall (6a) and the bottom wall (6b), between the bottom wall (6) and the lower component attachment plate (7), and between the internal thread members (12) and the upper component attachment plate (5) and the lower component attachment plate (7). In this manner, the power module base (1) is manufactured.

At the time of heating for the above-described brazing, the insulating substrate (3), the wiring layer (8), the heat transfer layer (9), the heat radiation substrate (2), the heat radiation fin (4), the upper component attachment plate (5), the circumferential wall (6a), the bottom wall (6b), the lower component attachment plate (7), and the internal thread members (12) thermally expand. These members are brazed in a thermally expanded state, and thermally contract after completion of the heating. The degree of thermal expansion of the heat radiation substrate (2) is greater than that of the insulating substrate (3), and, as a result, the degree of thermal contraction of the heat radiation substrate (2) is greater than that of the insulating substrate (3). Therefore, when the insulating substrate (3) and the heat radiation substrate (2) thermally contract as a result of being cooled to room temperature after completion of brazing, the degree of contraction of the heat radiation substrate (2) becomes larger than that of the insulating substrate (3), and the heat radiation substrate (2) is pulled by the insulating substrate (3), so that the heat radiation substrate (2) deforms to warp. However, even when the heat radiation substrate (2) deforms, the deformation of the heat radiation substrate (2) does not affect the upper component attachment plate (5) because the upper component attachment plate (5) is thicker than the heat radiation substrate (2) and has a high rigidity, and the upper component attachment plate (5) and the heat radiation substrate (2) are formed of aluminum and have little difference in linear expansion coefficient therebetween. Accordingly, the flatness of the upper component attachment plate (5) is maintained, and the upper surface of the upper component attachment plate (5) is maintained flat.

The above-described power module base (1) is used as follows. A power device (P) is joined to the wiring layer (8) of the insulating substrate (3) by means of, for example, soldering, whereby the power device (P) is mounted onto the power module base (1). Further, a resin casing (13) for covering the power device (P) and the insulating substrate (3) of the power module base (1) is attached to the upper component attachment plate (5), whereby a power module is completed. An outwardly extending flange (13a) is formed at a circumferential edge portion of a lower end opening of the resin casing (13). The resin casing (13) is attached to the upper component attachment plate (5) by use of external thread screws (14), which are passed through the outwardly extending flange (13a) from the upper side, then through the through holes (5a), and are screwed into the internal threaded holes (12a) of the internal thread members (12). Since the upper surface of the upper component attachment plate (5) is flat, when the resin casing (13) is attached to the upper component attachment plate (5), no clearance is formed between the outwardly extending flange (13a) of the resin casing (13) and the upper component attachment plate (5), and the interior of the resin casing (13) can be maintained in a sealed condition. Further, an electrical wiring frame and components necessary for the power module, such as electronic components, can be accurately attached to the upper component attachment plate (5).

Moreover, a housing for accommodating the entire power module, an electrical wiring frame, and various components necessary for the power module can be attached by making use of the lower component attachment plate (7).

The above-described power module is applied to, for example, an inverter circuit of a hybrid car in which an electric motor is used as a portion of a drive source, and the power module controls electric power supplied to the motor in accordance with the operating state.

During the control, heat generated from the power device (P) is transferred to the heat radiation fin (4) via the wiring layer (8), the insulating substrate (3), the heat transfer layer (9), and the heat radiation substrate (2), and is radiated from the heat radiation fin (4) to a cooling liquid flowing within the cooling jacket (6).

In some cases, the above-described power module base (1) is configured such that a stress relaxation member formed of a high-thermal-conduction material is interposed between the heat transfer layer (9) of the insulating substrate (3) and the heat radiation substrate (2), and is brazed to the heat transfer layer (9) and the heat radiation substrate (2).

In the case of a power module which uses the power module base (1) having a stress relaxation member, heat generated from the power device (P) is transferred to the heat radiation fin (4) via the wiring layer (8), the insulating substrate (3), the heat transfer layer (9), and the heat radiation substrate (2), and is radiated from the heat radiation fin (4) to a cooling liquid flowing within the cooling jacket (6). At that time, since the insulating substrate (3) and the heat radiation substrate (2) are heated to a high temperature (e.g., about 150° C.) by heat generated from the power device (P), the insulating substrate (3) and the heat radiation substrate (2) thermally expand. In particular, in the case where the heat radiation substrate (2) is formed of aluminum that is relatively excellent in thermal conductivity, since the linear expansion coefficient of aluminum is greater than that of the insulating substrate (3), the heat radiation substrate (2) is pulled by the insulating substrate (3) and is apt to warp due to a difference in thermal expansion between the heat radiation substrate (2) and the insulating substrate (3). However, by virtue of the action of the stress relaxation member, the force by which the heat radiation substrate (2) is pulled is reduced, whereby the heat radiation substrate (2) is prevented from warping.

Further, when the power module which uses the power module base (1) having a stress relaxation member is left in a lower temperature atmosphere (e.g., about −50° C.) for a long period of time, the heat radiation substrate (2) is apt to contract and warp, under the restraint by the insulating substrate (3), due to a difference in linear expansion coefficient between the heat radiation substrate (2) and the insulating substrate (3). However, by virtue of the action of the stress relaxation member, the force by which the heat radiation substrate (2) is pulled is reduced, whereby the heat radiation substrate (2) is prevented from warping.

Moreover, in the case where all the members are brazed in the course of manufacture of the power module base (1) having a stress relaxation member, the insulating substrate (3) and the heat radiation substrate (2) thermally expand at the time of heating for brazing, and are brazed together in a thermally expanded state. Subsequently, the insulating substrate (3) and the heat radiation substrate (2) thermally contract after completion of the heating. Since the heat radiation substrate (2) is formed of a high-thermal-conduction material such as aluminum and its linear expansion coefficient is larger than that of the insulating substrate (3), the degree of thermal expansion of the heat radiation substrate (2) is greater than that of the insulating substrate (3), and, as a result, the degree of thermal contraction of the heat radiation substrate (2) is greater than that of the insulating substrate (3). Therefore, when the insulating substrate (3) and the heat radiation substrate (2) thermally contract as a result of being cooled to room temperature after completion of brazing, the degree of contraction of the heat radiation substrate (2) becomes larger than that of the insulating substrate (3), and the heat radiation substrate (2) is pulled by the insulating substrate (3), so that the heat radiation substrate (2) is apt to warp. However, by virtue of the action of the stress relaxation member, the force by which the heat radiation substrate (2) is pulled is reduced, whereby the heat radiation substrate (2) is prevented from warping.

FIGS. 2 to 4 show examples of the stress relaxation member.

A stress relaxation member (20) shown in FIG. 2 is a plate-like body (21) which is formed of aluminum and in which a plurality of non-polygonal (in the present embodiment, circular) through holes (22) are formed in a staggered arrangement. The through holes (22) serve as stress absorbing spaces. The circular through holes (22) are formed in the plate-like body (21) at at least positions corresponding to a circumferential edge portion of the insulating substrate (3);

i.e., are formed over the entire plate-like body (21) including a circumferential edge portion thereof corresponding to the circumferential edge portion of the insulating substrate (3). Preferably, the plate-like body (21) is formed of a pure aluminum having a purity of 99% or higher, desirably 99.5% or higher, which exhibits high thermal conductivity, high deformability induced by a drop in strength caused by brazing heat, and excellent wettability in relation to a molten brazing material. The thickness of the plate-like body (21) is preferably 0.3 to 3 mm, desirably, 0.3 to 1.5 mm. The circle-corresponding diameter of the through holes (22) (in the present embodiment, the diameter of the through holes (22), because the through holes (22) are circular holes) is preferably 1 to 4 mm. Further, the ratio of the total of areas of all the through holes (22) to the area of one face of the plate-like body (21) preferably falls within a range of 3 to 50%.

Notably, in the stress relaxation member (20) shown in FIG. 2, the plurality of circular through holes (22) may be formed only in a circumferential edge portion of the plate-like body (21). In this case as well, as in the case of the stress relaxation member (20) shown in FIG. 2, the ratio of the total of areas of all the through holes (22) to the area of one face of the plate-like body (21) preferably falls within a range of 3 to 50%. Further, in the stress relaxation member (20) shown in FIG. 2, in place of the circular through holes (22), rectangular through holes may be formed. That is, the shape and arrangement of the through holes can be changed freely. Further, in place of the through holes (22), a plurality of recesses may be formed on at least one face of the plate-like body (21). In this case, each of the recesses may assume a concave spherical shape, a truncated conical shape, a square pyramidal shape, a rectangular parallelepiped shape, a groove shape, or a like shape. The shape and arrangement of the recesses can be changed freely. Through holes and recesses may be mixedly formed in the plate-like body (21).

A stress relaxation member (30) shown in FIG. 3 is formed from aluminum through cold forging, and is composed of a plate-like main body (31) and a plurality of solid, cylindrical columnar protrusions (32) formed on an upper surface of the plate-like main body (31) in a staggered arrangement such that the protrusions (32) are separated from one another. Distal end surfaces of the protrusions (32) are brazed to the heat transfer layer (9), and a lower surface of the plate-like main body (31) is brazed to the heat radiation substrate (2). Preferably, the stress relaxation member (30) is formed of a pure aluminum having a purity of 99% or higher, desirably 99.5% or higher, which exhibits high thermal conductivity, high deformability induced by a drop in strength caused by brazing heat, and excellent wettability in relation to a molten brazing material.

The thickness of the plate-like main body (31) is preferably 0.5 to 3 mm. When the thickness of the plate-like main body (31) is excessively small, the stress relaxation member (30) deforms insufficiently when a thermal stress is generated in the power module device (1) due to a difference in linear expansion coefficient between the insulating substrate (3) and the heat radiation substrate (2), whereby the stress relaxing performance of the stress relaxation member (30) may become insufficient. When the thickness of the plate-like main body (31) is excessively large, the thermal conductivity drops, whereby the heat radiation performance may drop.

In the case where the thermal stress generated in the power module device (1) is relatively large, preferably, the projection height of the protrusions (32) is larger than the diameter of a transverse cross section thereof. More preferably, the projection height of the protrusions (32) is greater than 0.8 mm but not greater than 1.5 mm, and the transverse-cross-section diameter of the protrusions (32) is not less than 0.8 mm but less than 1.5 mm. When the projection height of the protrusions (32) is excessively low and the transverse-cross-section diameter of the protrusions (32) is excessively large, the stress relaxation member (30) deforms insufficiently when a thermal stress is generated due to a difference in linear expansion coefficient between the insulating substrate (3) and the heat radiation substrate (2), whereby the stress relaxing performance of the stress relaxation member (30) may become insufficient. When the projection height of the protrusions (32) is excessively large and the transverse-cross-section diameter of the protrusions (32) is excessively small, the thermal conductivity drops, whereby the heat radiation performance may drop.

In the case where the thermal stress generated in the power module device (1) is relatively small, preferably, the projection height of the protrusions (32) is smaller than the diameter of a transverse cross section thereof. More preferably, the projection height of the protrusions (32) is 0.5 to 0.8 mm, and the transverse-cross-section diameter of the protrusions (32) is 1.5 to 3 mm. When the projection height of the protrusions (32) is excessively low and the transverse-cross-section diameter of the protrusions (32) is excessively large, the stress relaxation member (30) deforms insufficiently when a thermal stress is generated in the power module device (1) due to a difference in linear expansion coefficient between the insulating substrate (3) and the heat radiation substrate (2), whereby the stress relaxing performance of the stress relaxation member (30) may become insufficient. When the projection height of the protrusions (32) is excessively large and the transverse-cross-section diameter of the protrusions (32) is excessively small, the thermal conductivity drops, whereby the heat radiation performance may drop.

Notably, the stress relaxation member (30) shown in FIG. 3 may be combined with a heat conduction plate which is formed of a high-thermal-conduction material (in the present embodiment, aluminum) and which has a plurality of through holes through which the protrusions (32) of the stress relaxation member (30) pass. This heat conduction plate is placed on the upper surface of the plate-like main body (31) of the stress relaxation member (30) such that the protrusions (32) pass through the through holes, and is brazed to the heat transfer layer (9) of the insulating substrate (3) and the plate-like main body (31) of the stress relaxation member (30). Preferably, clearances are formed between outer circumferential surfaces of the protrusions (32) and inner circumferential surfaces of the through holes and between the upper surface of the plate-like main body (31) of the stress relaxation member (30) and the lower surface of the heat conduction plate. In this case, preferably, the clearances are filled with high-thermal-conduction grease or a thermal-conduction resin. Further, two stress relaxation members (30), each of which is identical with the stress relaxation member (30) shown in FIG. 3, may be disposed between the heat transfer layer (9) of the insulating substrate (3) and the heat radiation substrate (2). In this case, the upper-side stress relaxation member (30) is disposed such that the protrusions (32) face downward, and the lower-side stress relaxation member (30) is disposed such that the protrusions (32) face upward. The upper surface of the plate-like main body (31) of the upper-side stress relaxation member (30) is brazed to the heat transfer layer (9) of the insulating substrate (3), and the lower surface of the plate-like main body (31) of the lower-side stress relaxation member (30) is brazed to the heat radiation substrate (2). Further, in the stress relaxation member (30) shown in FIG. 3, a vertically extending through hole may be formed in each of the protrusions (32). Moreover, in the stress relaxation member (30) shown in FIG. 3, the shape of the protrusions can be changed freely.

A stress relaxation member (40) shown in FIG. 4 is a plate-like body (41) formed of a porous material. The plate-like body (41) is formed by use of woven or nonwoven fabric formed of metal fibers (e.g., aluminum fibers), woven or nonwoven fabric formed of carbon fibers, or woven or nonwoven fabric formed of ceramic fibers.

Although not shown in the drawings, the stress relaxation member interposed between the heat transfer layer (9) of the insulating substrate (3) and the heat radiation substrate (2) may be a plate-like body formed of a material having a linear expansion coefficient intermediate between the linear expansion coefficient of the insulating substrate (3) and the linear expansion coefficient of the heat radiation substrate (2). For example, in the case where the insulating substrate (3) is formed of ceramic and the heat radiation substrate (2) is formed of aluminum, preferably, the plate-like body of the stress relaxation member is formed of a material having a linear expansion coefficient of about $12 \times 10^{-6}/°C$.

FIG. 5 shows an example in which the above-described stress relaxation member (20), (30), or (40) is interposed between the heat transfer layer (9) of the insulating substrate (3) of the power module base (1) and the heat radiation substrate (2) thereof, and is brazed to the heat transfer layer (9) and the heat radiation substrate (2).

In the power module base having the above-described stress relaxation member (20), (30), or (40), instead of interposing a stress relaxation member formed of a high-thermal-conduction material between the heat transfer layer (9) of the insulating substrate (3) and the heat radiation substrate (2), the above-described stress relaxation member may be disposed in place of the heat transfer layer (9), brazed directly to the insulating substrate (3), and brazed to the heat radiation substrate (2).

INDUSTRIAL APPLICABILITY

The power module base of the present invention is preferably used to constitute a power module including a power device and effectively radiate heat generated from a semiconductor device. The power module base of the present invention enables various components necessary for the power module to be accurately attached.

Figure 1:
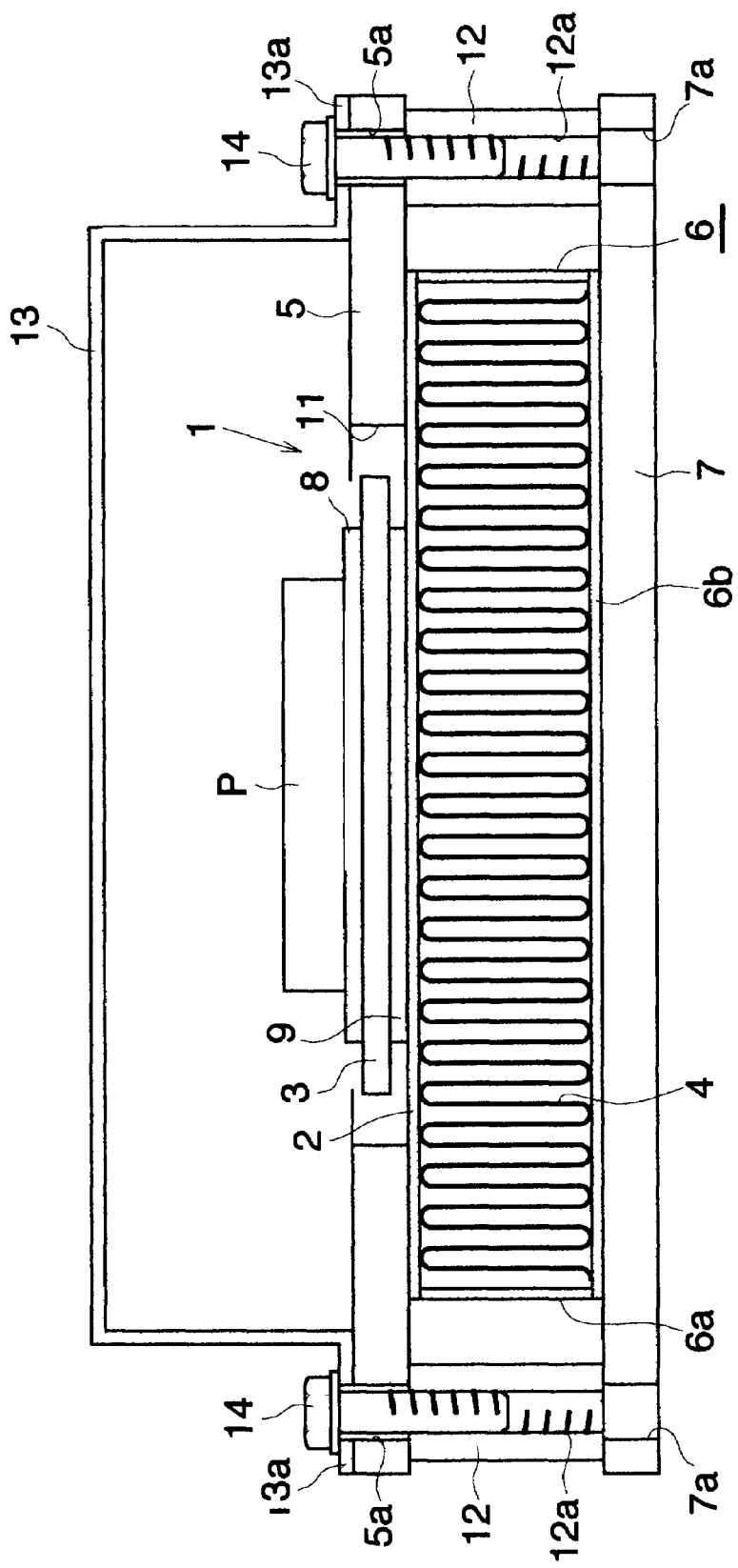
[FIG. 1] Enlarged vertical sectional view of a power module which uses a power module base according to the present invention.
Figure 2:
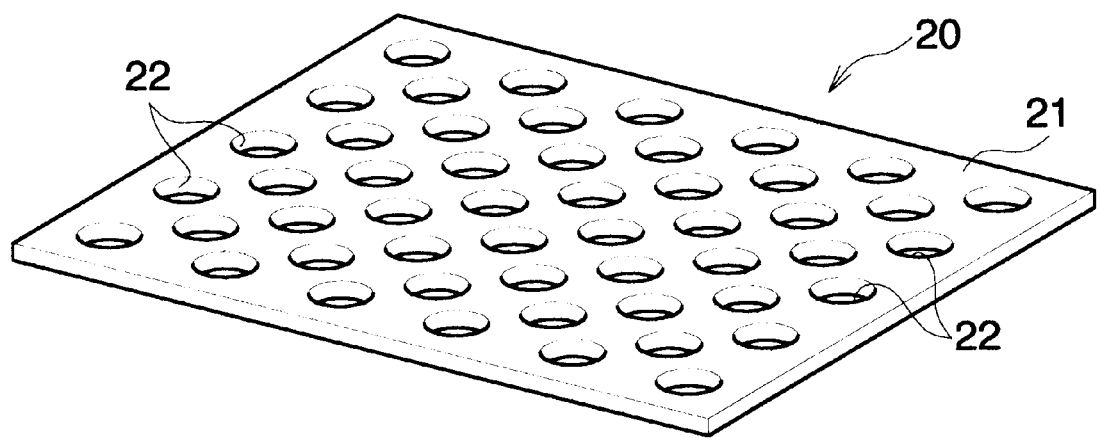
[FIG. 2] Perspective view showing an example of a stress relaxation member interposed between the insulating substrate and the heat radiation substrate and joined thereto.
Figure 3:
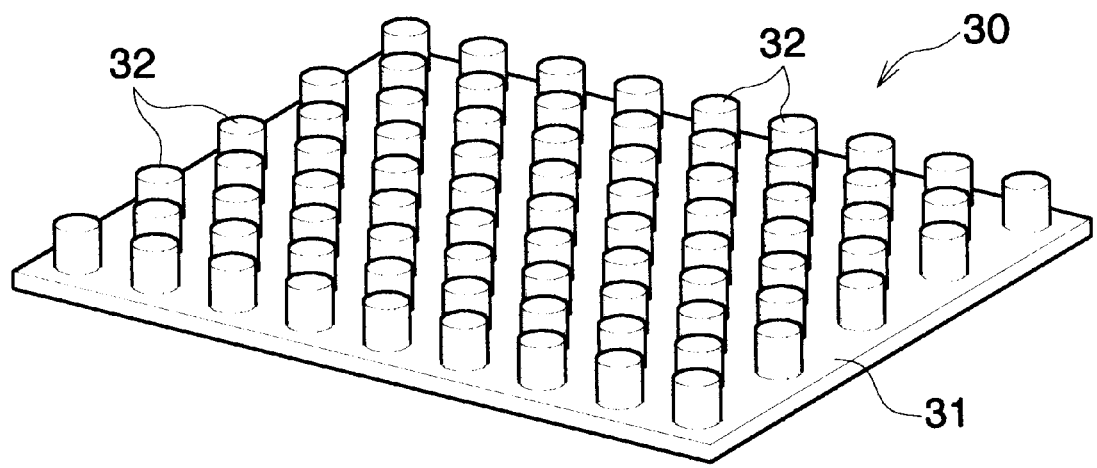
[FIG. 3] Perspective view showing another example of the stress relaxation member interposed between the insulating substrate and the heat radiation substrate and joined thereto.
Figure 4:
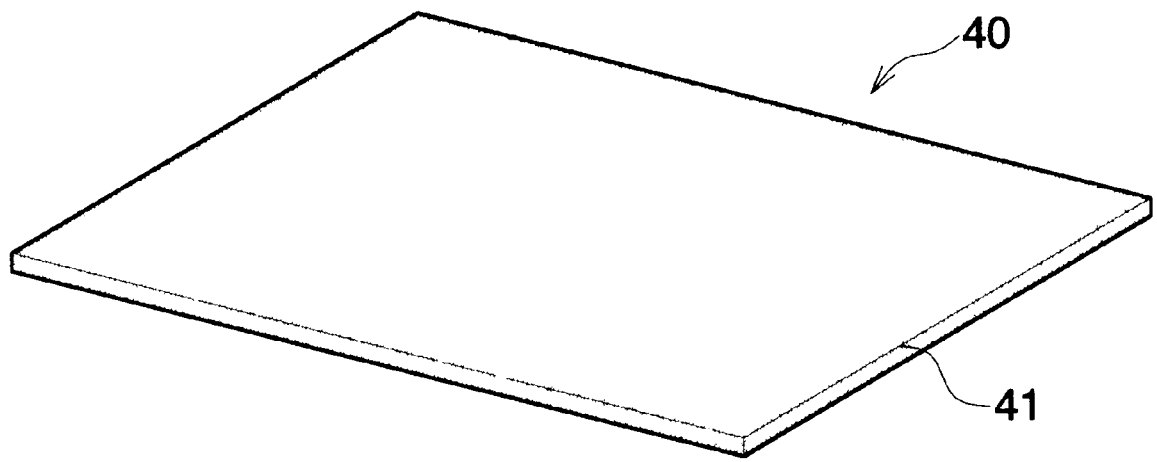
[FIG. 4] Perspective view showing still another example of the stress relaxation member interposed between the insulating substrate and the heat radiation substrate and joined thereto.
Figure 5:
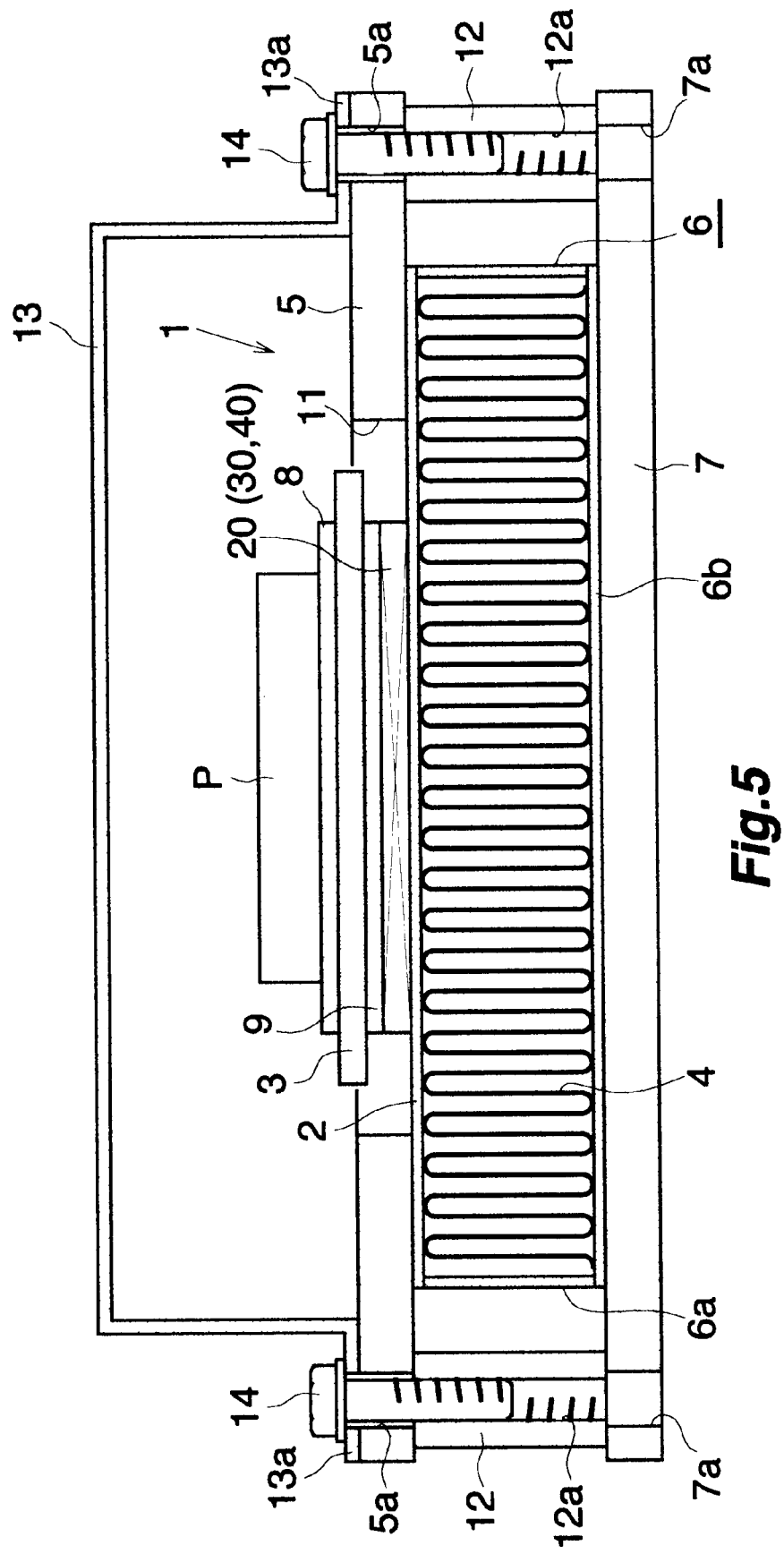
[FIG. 5] Sectional view corresponding to FIG. 1 and showing an example in which one of the stress relaxation members shown in FIGS. 2 to 4 is interposed between the heat transfer layer of the insulating substrate of the power module base and the heat radiation substrate thereof, and is brazed to the heat transfer layer and the heat radiation substrate.
Figure 6:
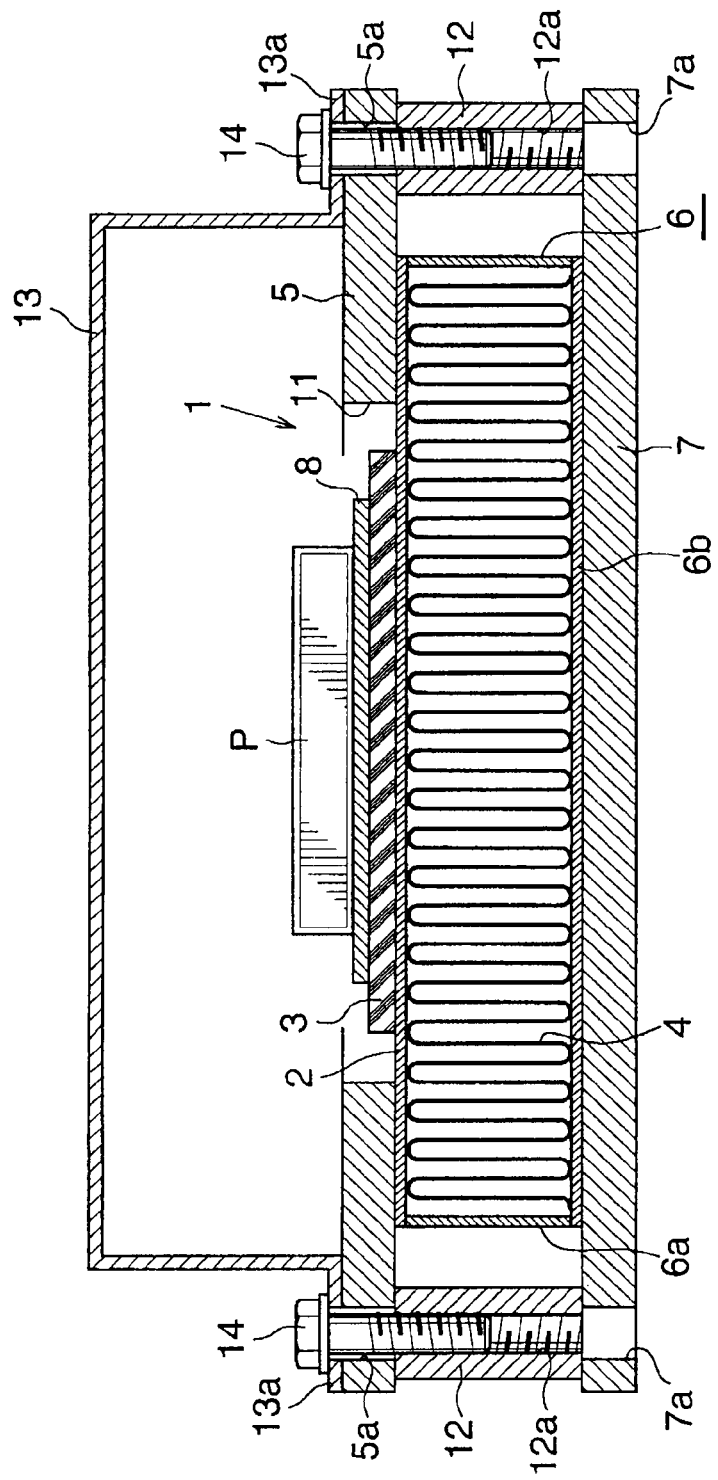
[FIG. 6] Sectional view showing an example in which the surface of the insulating substrate opposite the side where the wiring layer is provided is joined directly to the heat radiation substrate.

The invention claimed is:

1. A power module base comprising:
   a heat radiation substrate formed of a high-thermal-conduction material, the heat radiation substrate having a first surface and a second surface opposite to the first surface;
   an insulating substrate provided over the first surface of the heat radiation substrate;
   a stress relaxation member interposed between the insulating substrate and the heat radiation substrate;
   a wiring layer provided on a surface of the insulating substrate opposite a side where the insulating substrate is provided over the heat radiation substrate;
   a first component attachment plate joined to the first surface of the heat radiation substrate, the first component attachment plate having a through hole such that the insulating substrate is located within the through hole;
   a heat radiation fin brazed to the second surface of the heat radiation substrate;
   a cooling jacket fixed to the second surface of the heat radiation substrate such that the cooling jacket covers the heat radiation fin, the cooling jacket comprising a circumferential wall and a bottom wall that closes a lower end opening of the circumferential wall; and
   a second component attachment plate brazed to a surface of the bottom wall of the cooling jacket,
   wherein the first component attachment plate is thicker than the heat radiation substrate and brazed to the heat radiation substrate, the stress relaxation member is formed of a high-thermal-conduction material, the stress relaxation member is brazed to the insulating substrate and to the heat radiation substrate, the stress relaxation member comprises a plate-like body having a plurality of through holes formed therein, the heat radiation fin has a corrugate shape including wave crest portions, wave trough portions, and connection portions connecting the wave crest portions and the wave trough portions, the wave crest portions are brazed to the heat radiation substrate, and the wave trough portions are brazed to the cooling jacket.

2. A power module base according to claim 1, wherein the cooling jacket is configured such that a cooling liquid flows within the cooling jacket.

3. A power module base claim 1, wherein the second component attachment plate is joined to an outer surface of the bottom wall.

4. A power module base according to claim 3, wherein the first and second component attachment plates are connected together.

5. A power module base according to claim 1, wherein the insulating substrate is formed of a ceramic, and the ceramic is formed of aluminum nitride, aluminum oxide, or silicon nitride.

6. A power module base according to claim 1, wherein the wiring layer is formed of aluminum or copper.

7. A power module base according to claim 1, wherein the stress relaxation member is formed of a material having a linear expansion coefficient between a linear expansion coefficient of the insulating substrate and a linear expansion coefficient of the heat radiation substrate.

8. A power module comprising:
the power module base according to claim 1; and
a power device mounted on the wiring layer of the insulating substrate of the power module base.

9. A power module according to claim 8, further comprising a casing attached to the first component attachment plate and covering the power device and the insulating substrate of the power module base.

10. A power module base comprising:
a heat radiation substrate formed of a high-thermal-conduction material, the heat radiation substrate having a first surface and a second surface opposite to the first surface;
an insulating substrate provided over the first surface of the heat radiation substrate;
a wiring layer provided on a surface of the insulating substrate opposite a side where the insulating substrate is provided over the heat radiation substrate;
a heat transfer layer which is formed of a high-thermal-conduction material and is provided on a surface of the insulating substrate opposite the side where the wiring layer is provided;
a stress relaxation member interposed between the heat transfer layer and the heat radiation substrate,
a first component attachment plate joined to the first surface of the heat radiation substrate, the first component attachment plate having a through hole such that the insulating substrate is located within the through hole;
a heat radiation fin brazed to the second surface of the heat radiation substrate;
a cooling jacket fixed to the second surface of the heat radiation substrate such that the cooling jacket covers the heat radiation fin, the cooling jacket comprising a circumferential wall and a bottom wall that closes a lower end opening of the circumferential wall; and
a second component attachment plate brazed to a surface of the bottom wall of the cooling jacket,
wherein the first component attachment plate is thicker than the heat radiation substrate and brazed to the heat radiation substrate, the stress relaxation member is formed of a high-thermal-conduction material, the stress relaxation member is brazed to the heat transfer layer and to the heat radiation substrate, the stress relaxation member comprises a plate-like body having a plurality of through holes formed therein, the heat radiation fin has a corrugate shape including wave crest portions, wave trough portions, and connection portions connecting the wave crest portions and the wave trough portions, the wave crest portions are brazed to the heat radiation substrate, and the wave trough portions are brazed to the cooling jacket.

11. A power module base according to claim 10, wherein the surface of the insulating substrate opposite the side where the wiring layer is provided is joined directly to the heat transfer layer.

* * * * *